(12) United States Patent
Groetsch et al.

(10) Patent No.: US 8,502,252 B2
(45) Date of Patent: Aug. 6, 2013

(54) OPTOELECTRONIC COMPONENT, AND METHOD FOR THE PRODUCTION OF AN OPTOELECTRONIC COMPONENT

(75) Inventors: Stefan Groetsch, Lengfeld-Bad Abbach (DE); Thomas Zeiler, Nittendorf (DE); Michael Zitzlsperger, Regensburg (DE); Harald Jaeger, Regensburg (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 13/062,425

(22) PCT Filed: Aug. 20, 2009

(86) PCT No.: PCT/DE2009/001183
§ 371 (c)(1),
(2), (4) Date: Jun. 24, 2011

(87) PCT Pub. No.: WO2010/025701
PCT Pub. Date: Mar. 11, 2010

(65) Prior Publication Data
US 2012/0112337 A1    May 10, 2012

(30) Foreign Application Priority Data
Sep. 4, 2008   (DE) .......................... 10 2008 045 925

(51) Int. Cl.
*H01L 33/00* (2010.01)
(52) U.S. Cl.
USPC .......... 257/98; 257/E21.5; 257/100; 257/413; 438/122
(58) Field of Classification Search
CPC .................................. H01L 23/34; H01L 21/52
USPC ................ 257/E23.08, E21.5, 72, 81, 84, 88, 257/89, 95, 413, 446, 478, 488, 98–100, 257/666, 678, 698, 712; 438/122; 372/23, 372/43; 250/239, 397, 551
See application file for complete search history.

(56) References Cited

U.S. PATENT DOCUMENTS

| | | | |
|---|---|---|---|
| 5,748,658 A * | 5/1998 | Nakanishi et al. | 372/43.01 |
| 6,274,924 B1 * | 8/2001 | Carey et al. | 257/676 |
| 6,335,548 B1 * | 1/2002 | Roberts et al. | 257/98 |
| 6,376,902 B1 * | 4/2002 | Arndt | 257/678 |
| 6,517,218 B2 * | 2/2003 | Hochstein | 362/294 |

(Continued)

FOREIGN PATENT DOCUMENTS

| | | |
|---|---|---|
| DE | 10 2004 021870 | 12/2005 |
| DE | 10 2007 033057 | 1/2008 |
| JP | 2007095797 | 4/2007 |
| WO | WO 00/55914 | 9/2000 |

*Primary Examiner* — Chris Chu
(74) *Attorney, Agent, or Firm* — Cozen O'Connor

(57) ABSTRACT

An optoelectronic component (1) is provided, having at least two connecters (2) for electrical contacting of the component (1), a housing body (3), in which the connecters (2) are embedded in places, a heat sink (4), which is connected to at least one connecter (2), wherein the housing body (3) is formed of a plastics material, the housing body (3) comprises an opening (30), in which the heat sink (4) is freely accessible in places, at least one optoelectronic semiconductor chip (5) is arranged in the opening (30) on the heat sink (4), and at least two of the connecters (2) each comprise a chip-end portion (2c), which faces the at least one optoelectronic semiconductor chip (5), wherein the chip-end portions (2c) of the at least two connecters (2) are arranged in a common plane.

15 Claims, 2 Drawing Sheets

U.S. PATENT DOCUMENTS

| | | | | |
|---|---|---|---|---|
| 6,860,621 | B2 * | 3/2005 | Bachl et al. | 362/373 |
| 6,897,486 | B2 * | 5/2005 | Loh | 257/81 |
| 6,936,855 | B1 * | 8/2005 | Harrah | 257/88 |
| 7,012,277 | B2 * | 3/2006 | Takenaka | 257/79 |
| 7,075,114 | B2 * | 7/2006 | Abe et al. | 257/98 |
| 7,173,951 | B2 * | 2/2007 | Shinohara et al. | 372/36 |
| 7,276,739 | B2 * | 10/2007 | Chen et al. | 257/99 |
| 7,280,288 | B2 * | 10/2007 | Loh et al. | 359/726 |
| 7,381,996 | B2 * | 6/2008 | Hsin Chen | 257/100 |
| 7,626,250 | B2 * | 12/2009 | Lee et al. | 257/675 |
| 7,692,206 | B2 * | 4/2010 | Loh | 257/99 |
| 7,714,348 | B2 * | 5/2010 | Fan et al. | 257/99 |
| 7,994,526 | B2 * | 8/2011 | Han et al. | 257/98 |
| 8,159,000 | B2 * | 4/2012 | Lee et al. | 257/99 |
| 2003/0168720 | A1 * | 9/2003 | Kamada | 257/666 |
| 2004/0075100 | A1 * | 4/2004 | Bogner et al. | 257/99 |
| 2004/0140543 | A1 * | 7/2004 | Elpedes et al. | 257/676 |
| 2005/0135105 | A1 * | 6/2005 | Teixeira et al. | 362/294 |
| 2005/0239227 | A1 * | 10/2005 | Aanegola et al. | 438/26 |
| 2006/0102917 | A1 | 5/2006 | Oyama et al. | |
| 2008/0179620 | A1 | 7/2008 | Chang | |

* cited by examiner

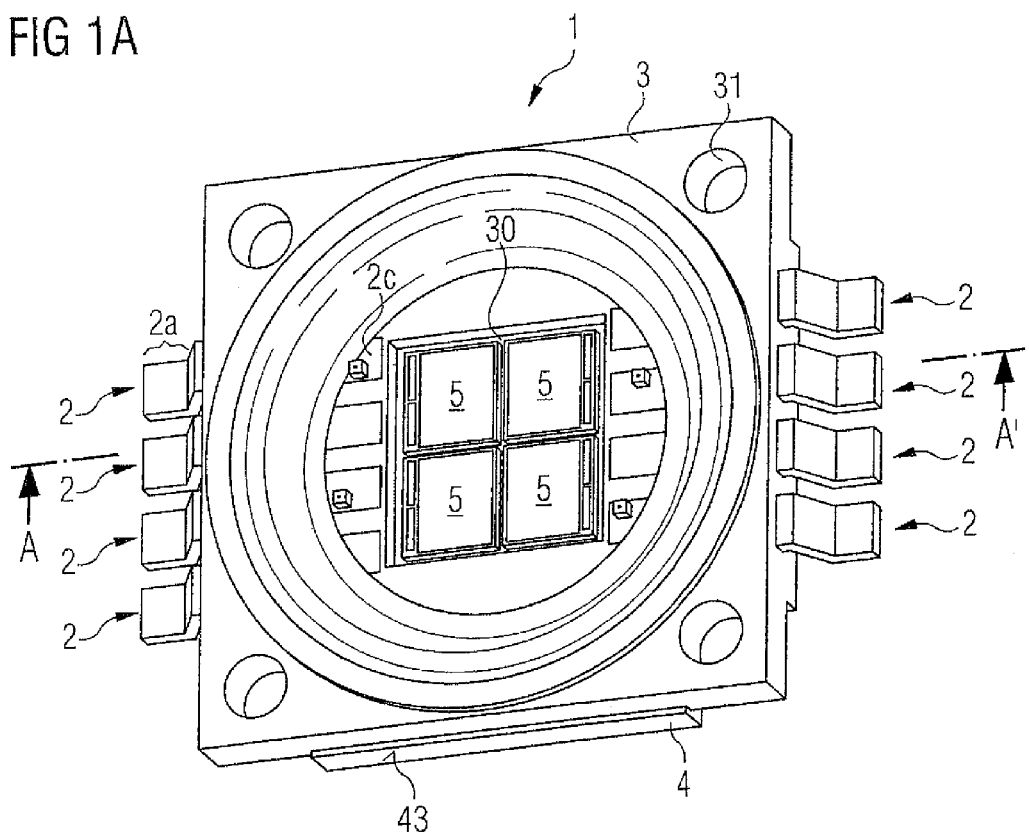
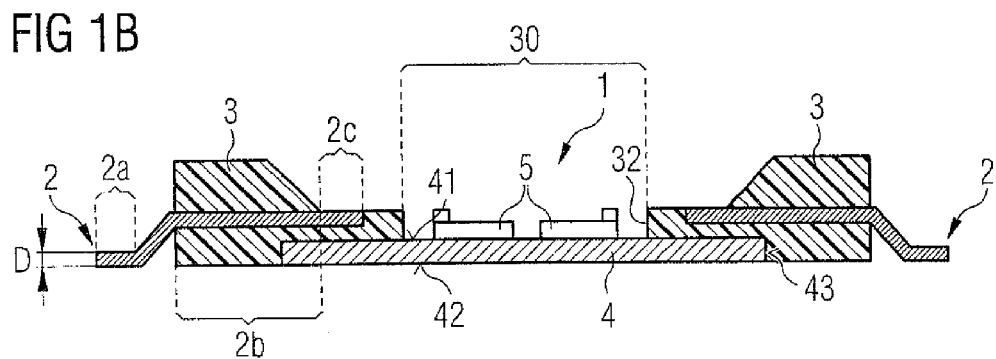

OPTOELECTRONIC COMPONENT, AND METHOD FOR THE PRODUCTION OF AN OPTOELECTRONIC COMPONENT

RELATED APPLICATIONS

This is a U.S. national stage of application No. PCT/DE2009/001183, filed on Aug. 20, 2009

This patent application claims priority from German patent application 102008045925.9, filed Sep. 4, 2008, the disclosure content of which is hereby incorporated by reference.

BACKGROUND OF THE INVENTION

An optoelectronic component is provided.

SUMMARY OF THE INVENTION

One object of the invention is to provide an optoelectronic component which is distinguished by particularly good heat dissipation. A further object is to provide a method of producing such a component which is particularly inexpensive.

According to at least one embodiment of the optoelectronic component, the optoelectronic component comprises at least two connecters, which serve in electrical contacting of the component, i.e. the electrical component may be electrically contacted from outside the component by means of the connecters. The connecters are connected electrically conductively to at least one semiconductor chip of the optoelectronic component, which may in this way be supplied with power by means of the connecters. It is possible, in this respect, for the electrical component to comprise two, four or more connecters.

According to at least one embodiment of the optoelectronic component, the optoelectronic component comprises a housing body. The connecters of the optoelectronic component are embedded in the housing body in places. "Embedded in places" here means that the connecters each comprise a region, the housing portion, in which they are surrounded by the housing body. In this housing portion the housing material directly adjoins the connecter. Furthermore, the connecters preferably each have a connecting portion, which is located outside the housing body. In this connecting portion the connecters are for example freely accessible from all sides and in particular free of housing material. The connecters may additionally each comprise a chip-end portion, facing a semiconductor chip of the optoelectronic component. In their chip-end portion the connecters are at least partially exposed, i.e. at least in places they are not covered by the housing body. In the chip-end portion the connecters may be connected electrically conductively to a semiconductor chip of the optoelectronic component.

According to at least one embodiment of the optoelectronic component, said component further comprises a heat sink connected to at least one connecter, i.e. the heat sink is connected mechanically fixedly to at least one connecter. The heat sink may also be connected electrically conductively to the connecter. The heat sink is then at the same electrical potential as the connecter with which it is connected.

The heat sink for example comprises a plate-like body, which may consist of a readily heat-conductive material such as a metal, a ceramic material or a doped semiconductor material. It is in particular possible for the heat sink to consist of the same material as the connecter, for example a metal. The heat sink absorbs heat generated by an optoelectronic semiconductor chip of the component when in operation and dissipates this heat to regions outside of the optoelectronic component.

According to at least one embodiment of the optoelectronic component, the housing body is formed of a plastics material. In this case it is in particular possible for the housing body to consist of a plastics material. Further materials may be introduced into the plastics material of the housing body. For example radiation-reflecting, heat-conducting or radiation-absorbing particles may be introduced into the plastics material. Furthermore, the plastics body may contain additives, which improve adhesion of the housing body to the connecters which are embedded in places in the housing body.

According to at least one embodiment of the optoelectronic component the housing body comprises an opening in which the heat sink is freely accessible in places, i.e. a recess, a hole or a window is formed in the housing body, in which the heat sink is exposed. In this respect, the top face of the heat sink is exposed in places. However, the heat sink also comprises regions on its top face, outside the opening in the housing body, in which it is covered by the housing body. In these regions the heat sink is then not exposed, and is not freely accessible there. The freely accessible points on the top face of the heat sink are for example laterally enclosed by the housing body.

According to at least one embodiment of the optoelectronic component, at least one optoelectronic semiconductor chip is arranged in the opening on the heat sink. The optoelectronic semiconductor chip may then be fastened to the heat sink by means of an adhesive or a solder material. It is also possible for the optoelectronic semiconductor chip to be connected electrically conductively to the heat sink. In this case the heat sink is preferably at the same potential as the connecter to which it is connected.

The optoelectronic semiconductor chip for example comprises a luminescent diode chip, i.e. a laser diode chip or a light-emitting diode chip. It is furthermore possible for the optoelectronic semiconductor chip to be a photodiode, which is intended to detect electromagnetic radiation when in operation.

According to at least one embodiment of the optoelectronic component, at least two of the connecters each comprise a chip-end portion facing the at least one semiconductor chip, i.e. at least two of the connecters comprise a chip-end portion in which they are partially exposed, namely not covered by the housing body and not embedded therein. In this portion they may be electrically conductively connected with the at least one semiconductor chip. The semiconductor chip and the chip-end portions of the connecters may be covered by an encapsulating material, which is at least partially transmissive to the radiation generated or to be detected by the semiconductor chip when in operation.

The connecters additionally extend through the housing body, in which they are embedded in their housing portion. The connecters break through the housing body and are exposed in their connecting portion adjoining the housing portion. At this point the connecters serve in electrical contacting of the optoelectronic component.

According to at least one embodiment of the optoelectronic component, the chip-end portions of the at least two connecters, which each comprise a chip-end portion facing the at least one optoelectronic semiconductor chip, are arranged in a common plane, i.e., of the two chip-end portions, the one is not located higher than the other but rather both are arranged in one plane and do not project beyond one another. The plane is formed for example by the top face of the heat sink or extends parallel to the top face of the heat sink.

According to at least one embodiment of the optoelectronic component, the optoelectronic component comprises at least two connecters for electrical contacting of the component. In addition, the component comprises a housing body, in which the connecters are embedded in places. The optoelectronic component further comprises a heat sink which is connected to at least one connecter, wherein the housing body is formed of a plastics material, the housing body comprises an opening, in which the heat sink is freely accessible in places, at least one optoelectronic semiconductor chip is arranged on the heat sink in the opening, and at least two of the connecters each comprise a chip-end portion facing the at least one optoelectronic semiconductor chip, wherein the chip-end portions of the at least two connecters are arranged in a common plane.

All in all, such an optoelectronic component is distinguished in that it may on the one hand be produced particularly simply. For example, the connecters of the optoelectronic component are present in the carrier strip assembly during production of the component. A carrier strip assembly, in which the chip-end portions of the connecters are arranged in a common plane, is in this case particularly easy to process. The optoelectronic component may thereby be produced using a continuous method such as for example a roll-to-roll method.

The heat sink, which is connected at least to one of the connecters, enables an optoelectronic component in which heat generated by the optoelectronic semiconductor chip may be dissipated particularly efficiently.

The fact that the heat sink dissipates the heat generated by the optoelectronic semiconductor chip particularly efficiently enables a simple plastics material to be used as housing body, wherein, due to the good heat dissipation by the heat sink, the plastics material for the housing body does not have to fulfill stringent requirements with regard to temperature stability. In particular, an expensive ceramic material may in this case be dispensed with for the housing body.

The use of a plastics material further allows a suitable and a technically feasible shaping of the housing body, for example by means of injection moulding.

According to at least one embodiment of the optoelectronic component, the plastics material of the housing body is an epoxy resin i.e. the housing body consists of or contains epoxy resin.

According to at least one embodiment of the optoelectronic component, the plastics material of the housing body consists of silicone or contains silicone.

It is furthermore possible for the plastics material of the housing body to be a silicone-epoxy resin hybrid material. For example, this hybrid material may comprise 50% epoxy resin and 50% silicone. In addition, the plastics material may contain fillers, which serve to reduce the coefficients of thermal expansion and/or as adhesion promoters.

The stated plastics materials are distinguished by simple processability and thus by inexpensive production of the optoelectronic component. Furthermore, silicone is in particular particularly resistant to electromagnetic radiation generated by the optoelectronic component.

According to at least one embodiment of the optoelectronic component, the heat sink comprises a top face on which the at least one optoelectronic semiconductor chip has been placed. The heat sink further comprises a bottom face, remote from the top face. The optoelectronic component may be mounted on a component mounting surface with the bottom face of the heat sink. The heat generated by the optoelectronic semiconductor chip is then dissipated particularly efficiently from the top face to the bottom face and from there to the mounting face. Furthermore, the heat sink comprises at least one side face, which connects together the top face and the bottom face.

For example, the heat sink is cuboid. The side face of the heat sink is then provided by a side face of the cuboid.

For example, the side face is in this case free of the plastics material of the housing body, i.e. the heat sink does not have to be completely surrounded by the housing material, it being possible for at least one side face or indeed all the side faces of the heat sink to be free of the housing body. In this case, the bottom face of the heat sink is then also free of the housing body. In this way, the heat sink may particularly efficiently dissipate heat generated by the optoelectronic semiconductor chip when in operation to the surrounding environment, since the heat does not have to pass through the plastics material of the housing body. In an extreme case, the top face of the heat sink is merely covered in places by the housing body. The remaining face portions, in particular the side faces and the bottom face of the heat sink, are then free of the plastics material of the housing body.

It is alternatively also possible for the side faces and bottom face of the heat sink to be covered completely by the housing material. Although this results in impaired heat dissipation, on the other hand the adhesion between housing material and heat sink may be improved.

According to at least one embodiment of the optoelectronic component, the heat sink comprises a fastening portion. In this fastening portion the heat sink may be connected mechanically to a mounting face for the optoelectronic component. The fastening portion of the heat sink preferably projects laterally beyond the housing body, i.e. the heat sink is not in this case flush with the housing body and also the housing body does not project laterally beyond it all around, but at at least one point—the fastening portion of the heat sink—the heat sink projects laterally beyond the housing body. This also results in the heat sink in this case having an enlarged area, which improves heat dissipation to the surrounding environment, since heat generated by the optoelectronic semiconductor chip may be dissipated over a larger area.

According to at least one embodiment of the optoelectronic component, the heat sink comprises an opening in the fastening portion, which is provided for accommodating a fastening means. The opening may for example be a recess, a hole, a clearance or a bore. A fastening means may engage in the opening. The fastening means for example comprises a clamping device or a dowel pin or a screw. The fastening means engages in the opening in the heat sink and connects the heat sink and thus the entire optoelectronic component mechanically firmly to a mounting surface for the optoelectronic component.

According to at least one embodiment of the optoelectronic component, at least one connecter is configured in its connecting portion remote from the chip-end portion as a soldering lug, i.e. the optoelectronic component then comprises a soldering terminal with at least one soldering lug for the purpose of electrical connection. This has proven particularly advantageous in particular in conjunction with a heat sink, which projects laterally beyond the housing body in a fastening portion and comprises an opening in the fastening portion, which is intended for accommodating a fastening means. In this case the electrical connection, via the connecter, may be decoupled from mechanical fastening of the optoelectronic component, via the fastening portion of the heat sink.

As an alternative to a soldering lug it is also possible for the connecting portion of the connecter to take the form of a plug for a plug-and-socket connection. In this case the optoelectronic component may be electrically connected via a reversible plug-and-socket connection. Reversible here means that the electrical connection may be made and broken non-destructively.

The connecter configured in its connecting portion as a soldering lug or plug may extend in particular transversely of the fastening portion of the heat sink. For example, the main direction of extension of the fastening portion and the main direction of extension of the connecter then form an acute angle or a 90° angle with one another. This simplifies the decoupling of mechanical and electrical contacting of the optoelectronic component.

According to at least one embodiment of the optoelectronic component, the optoelectronic component comprises at least three connecters. Preferably, the optoelectronic component then comprises a number of connecters, which amounts to twice the number of optoelectronic semiconductor chips present in the optoelectronic component, i.e. if four semiconductor chips are for example arranged in the optoelectronic component, the optoelectronic component may comprise eight connecters. This then makes it possible to actuate each of the optoelectronic semiconductor chips separately from the other optoelectronic semiconductor chips of the optoelectronic component.

It is then possible for at least two of the connecters to be connected, for example welded, to the heat sink. The connecters which are connected to the heat sink are preferably at the same electrical potential as the heat sink. If the optoelectronic component comprises for example eight connecters, four of the connecters are preferably connected electrically conductively to the heat sink and welded thereto. The semiconductor chips of the optoelectronic component may then be electrically contacted on the n-side via the heat sink. Assigned to each of the optoelectronic semiconductor chips is a connecter, which is not connected to the heat sink and by means of which the optoelectronic semiconductor chip may be contacted on the p-side. In very general terms, half of all the connecters may for example be connected mechanically firmly and electrically conductively to the heat sink. The other half of the connecters are then not connected electrically conductively to the heat sink, but rather is electrically insulated therefrom.

Such a structure is distinguished, due to the connection of a relatively large number of connecters to the heat sink, by particularly high mechanical stability.

According to at least one embodiment of the optoelectronic component, the optoelectronic component comprises four or more semiconductor chips. The optoelectronic semiconductor chips are placed on the top face of the heat sink. Such a large number of optoelectronic semiconductor chips is possible in this case, since the heat generated by the optoelectronic semiconductor chip when in operation may be dissipated to the outside particularly efficiently via the heat sink.

According to at least one embodiment, the heat sink comprises a base area which amounts to at least 90% of the base area of the housing body. In this case it is also possible for the heat sink to comprise a larger base area than the housing body. A heat sink of such size is distinguished in that the heat generated by the optoelectronic semiconductor chips of the component when in operation may be distributed over a particularly large area.

A method of producing an optoelectronic component is additionally provided. An optoelectronic component as described here may preferably be produced by means of the method. This means that the features disclosed in relation to the optoelectronic component are also disclosed for the method described here.

According to at least one embodiment of the method of producing an optoelectronic component, the component comprises the following method steps in the following sequence:

providing at least two connecters, connecting at least one connecter to a heat sink, producing a housing body, in which the connecters are embedded in places, an opening to the heat sink being provided in the housing body, and fastening at least one optoelectronic semiconductor chip to the heat sink in the opening in the housing body.

That is to say, in the method described the housing body is produced before the semiconductor chip is fastened to the heat sink. An opening is left free in the housing body, in which opening the top face of the heat sink is freely accessible. The semiconductor chips are then introduced into this opening after production of the housing body. The housing body may then for example be produced by means of an injection moulding or transfer moulding method.

According to one embodiment of the method described here, the connecters are arranged during the method in a carrier strip assembly, i.e. the connecters are present in a carrier strip (or lead frame) assembly. The connecters may therefore be processed in a continuous, for example roll-to-roll (reel-to-reel) method.

For example, during production of the optoelectronic components first of all a heat sink is connected mechanically to a given number of connecters. This may proceed by spot welding. Then a housing body is produced for each optoelectronic component in such a way that the connecters of the component to be produced are embedded in places in the housing body. The optoelectronic semiconductor chips for each component are then mounted on the associated heat sink in an opening on the housing body. Finally, the carrier strip assembly may be singulated into individual optoelectronic components.

BRIEF DESCRIPTION OF THE DRAWINGS

The optoelectronic component described herein is explained in greater detail below with reference to exemplary embodiments and the associated figures.

FIG. 1A is a schematic perspective representation of a first exemplary embodiment of an optoelectronic component described herein.

FIG. 1B is a schematic sectional representation of the first exemplary embodiment of an optoelectronic component described herein.

DETAILED DESCRIPTION OF THE DRAWINGS

Figure 2:
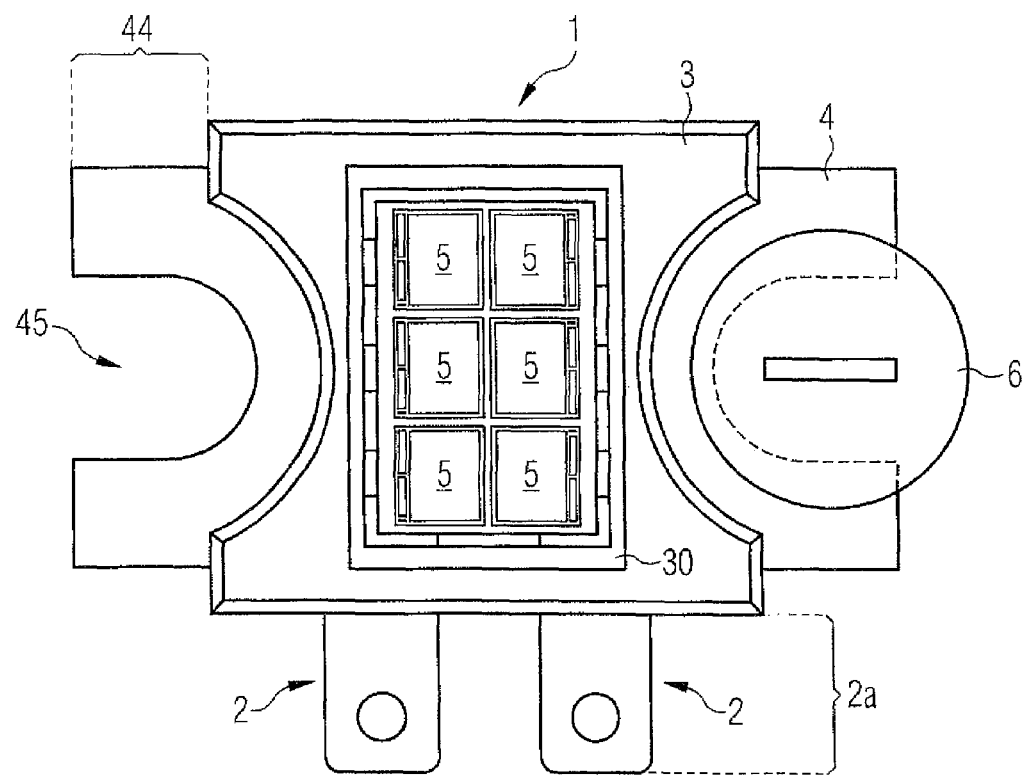
FIG. 2 is a schematic perspective representation of a second exemplary embodiment of an optoelectronic component described herein.

Identical, similar or identically acting elements are provided with the same reference numerals in the Figures. The Figures and the size ratios of the elements illustrated in the Figures relative to one another are not to be regarded as being to scale. Rather, individual elements may be illustrated on an exaggeratedly large scale for greater ease of depiction and/or better comprehension.

The optoelectronic component 1 described in conjunction with FIG. 1A comprises four optoelectronic semiconductor chips 5. The optoelectronic semiconductor chips 5 are in this case light-emitting diode chips. The optoelectronic semiconductor chips 5 are placed on the top face 41 of a heat sink 4. The heat sink 4 consists in this case of a metal such as copper or aluminum.

The heat sink 4 may furthermore be particularly thick in the case of the optoelectronic components described here. A thickness D of between 0.8 mm and 2.0 mm, in particular in the range from 1.2 mm to 1.6 mm is for example possible. The heat sink 4 then preferably consists of copper, which is distinguished by its good thermal conductivity and relatively low costs.

The optoelectronic component 1 further comprises eight connecters 2. Each of the connecters 2 comprises a connecting portion 2a, by means of which the optoelectronic component 1 may be electrically connected. In addition, each of the connecters 2 comprises a housing portion 2b, in which the connecters 2 are embedded into the material of the housing body 3. Furthermore, each of the connecters 2 comprises a chip-end portion 2c. The chip-end portions 2c are not covered by the housing material 3 in places and face the optoelectronic semiconductor chips 5. All the chip-end portions 2c are arranged in a common plane, i.e. none of the connecters projects beyond the others in the region of the chip-end portions 2c. The housing body comprises an opening 30, in which the heat sink 4 is freely accessible. The optoelectronic semiconductor chips 5 are arranged in this opening 30 on the heat sink.

The opening 30 may in this case be relatively large. For instance, the opening 30 may amount to three or more times the total of the chip areas of the optoelectronic semiconductor chips 5. If a single optoelectronic semiconductor chip 5 is used, the size of the opening 30 may for example amount to four times the chip size. The more chips are mounted on the heat sink, the smaller is the surface area ratio between the opening 30 and the total of chip areas.

The outermost connecters 2 on each side of the optoelectronic component 1 are connected mechanically to the heat sink 4. These connecters 2 are for example connected to the heat sink by means of spot welding. The remaining connecters are decoupled electrically from the heat sink. For example, material of the housing body 3 may be located in these regions between heat sink 4 and connecter 2, see FIG. 13.

In addition the housing body 3 comprises four recesses 31. The recesses 31 serve to accommodate dowel pins or screws, by means of which the optoelectronic component may be adjusted on and/or fastened to a mounting surface.

A plastics material is preferably used as the housing material for the housing body 3. For example, epoxy resin, a hybrid material of silicone and epoxy resin or a moulded silicone may be used. The housing material may additionally contain fillers, which enhance the mechanical and optical characteristics of the material and optionally adhesion to an encapsulating material (not shown), with which the optoelectronic semiconductor chips are encapsulated. Furthermore, the housing material may contain fillers which improve adhesion to the connecters 2. The housing body 3 serves to cover the connecters 2 and, together with the heat sink 4, forms the housing of the optoelectronic component. To adjust the mechanical properties of the housing body 3 the housing material may for example contain glass fibres and/or inorganic fillers.

The optoelectronic semiconductor chips in the opening 30 in the housing material are suitable for emitting electromagnetic radiation in the wavelength range of ultraviolet to infrared radiation. For example, the optoelectronic semiconductor chips are light-emitting diode chips emitting blue or ultraviolet light. A luminescence conversion material is then arranged downstream of the optoelectronic semiconductor chip, which material converts at least part of the radiation generated into light of a different wavelength. In this way, white mixed light may in particular also be emitted by the optoelectronic component.

The housing body 3 may in this case be black. For example, the housing material may contain carbon black, so that the housing body 3 absorbs radiation.

Furthermore it is also possible for the housing body 3 to be formed of a clear plastics material, which is transparent.

In addition, the housing body 3 may for example be made reflective or white by the addition of suitable filler particles, which may for example comprise titanium oxide.

The housing body 3 comprises a circumferential wall 32 facing the optoelectronic semiconductor chips 5. The circumferential wall 32 ensures shading of radiation emitted laterally by the semiconductor chips 5, which has not for example been converted by a luminescence conversion material. The luminescence conversion material may in this case be located on the top of the semiconductor chip 5 remote from the heat sink 4.

The optoelectronic semiconductor chips may for example be semiconductor chips of thin-film construction, a growth substrate having been removed or at least thinned. Such thin-film chips are also distinguished inter alia in that they emit the predominant part of the electromagnetic radiation generated in operation solely through their top. At the side faces these thin-film chips emit virtually or absolutely no electromagnetic radiation.

To protect the housing body 3 from electromagnetic radiation generated by the optoelectronic semiconductor chips 5, the housing body may additionally be reflectively coated or protected by a coating or a foil at points where electromagnetic radiation may impinge on it.

Further, non-optoelectronic components may for example be integrated into the housing body 3, i.e. be encapsulated or surrounded by the housing material. These components may for example comprise ESD protection diodes, varistors, temperature sensors and/or closed- and open-loop control electronics.

In addition, the optoelectronic component may contain both radiation-emitting and radiation-receiving optoelectronic semiconductor chips 5. The component is then intended for example to form a reflex light barrier. The optoelectronic component may in this case in particular contain a plurality of openings 30 in the housing body 3. For instance, detector chips, such as for example photodiodes and emitter chips, such as for example laser or light-emitting diodes, may be arranged in different openings 30 in the housing body 3. The chips are decoupled optically from one another by the material of the housing body 3 arranged therebetween.

A further exemplary embodiment of an optoelectronic component described herein is explained in greater detail in conjunction with the schematic perspective representation of FIG. 2. In this exemplary embodiment the heat sink 4 comprises a larger base area than the housing body 3. The heat sink 4 comprises fastening portions 44, which project laterally beyond the housing body. The fastening portions 44 contain openings 45, which serve to accommodate a fastening means 6. The fastening means 6 may for example comprise a screw, with which the optoelectronic component may be mechanically fastened to a mounting surface. Alternatively, the component may for example be snapped onto a mounting surface.

The component additionally comprises two connecters 2, which each take the form of soldering lugs. Mechanical fastening of the component by means of the fastening portions 44 of the heat sink 4 is decoupled from electrical contacting by means of the soldering lugs of the connecter 2. The connecters 2 are arranged such that they extend transversely of the heat sink 4. As an alternative to a soldering lug, the connecters 2 may also take the form of a plug for a plug-and-socket connection.

Overall, the optoelectronic component, as described in conjunction with the figure, does not take the form of a surface-mountable (SMT) component. In the case in particular of the component as described in conjunction with FIG. 2, the heat conduction path via the heat sink is decoupled from electrical conduction via the connecters 2.

The optoelectronic components described herein are distinguished in particular by particularly inexpensive production and very effective heat dissipation. The components may be produced by a continuous roll-to-roll method. As a result of the heat sink 4, which is connected directly to the semiconductor chip 5 and may be constructed to have a very large area, they exhibit particularly good heat dissipation.

The heat sink may, in particular in the exemplary embodiment of FIG. 2, be decoupled electrically from the connecters 2. In this case, material of the housing body 3 is arranged between connecters 2 and heat sink 4. Mechanical connection between the connecters 2 and the heat sink 4 in this case proceeds for example via the housing body 3, which may then cover the heat sink 4 at the side faces 43 thereof and optionally also at the bottom face 42 thereof at least in places or completely.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic component comprising:
   at least two connecters for electrical contacting of the component;
   a housing body, in which the connecters are embedded in places; and
   a heat sink, which is connected to at least one of the connecters and extends in a first plane, wherein
   the housing body is formed of a plastics material,
   the housing body comprises an opening, in which the heat sink is freely accessible in places,
   at least one optoelectronic semiconductor chip is arranged in the opening on the heat sink, and
   at least two of the connecters each comprise a chip-end portion, which faces the at least one optoelectronic semiconductor chip, wherein the chip-end portions of the at least two connecters are arranged on the heat sink in a second, common plane, which is different from the first plane.

2. The optoelectronic component according to claim 1, wherein the plastics material of the housing body is epoxy resin or contains epoxy resin.

3. The optoelectronic component according to claim 1, wherein the plastics material of the housing body is silicone or contains silicone.

4. The optoelectronic component according to claim 1, wherein the heat sink comprises:
   a top face, on which the at least one optoelectronic semiconductor chip is placed,
   a bottom face, remote from the top face, and
   a side face, which connects together the top face and the bottom face, wherein the side face is free of the plastics material of the housing body.

5. The optoelectronic component according to claim 1, wherein the heat sink projects laterally beyond the housing body in a fastening portion of the heat sink.

6. The optoelectronic component according to claim 5, wherein the heat sink comprises an opening in the fastening portion, which opening is intended for accommodating a fastening means.

7. The optoelectronic component according to claim 1, wherein at least one of the connecters is configured in a connecting portion remote from its chip-end portion as a soldering lug.

8. The optoelectronic component according to claim 1, wherein at least one of the connecters is configured in a connecting portion remote from its chip-end portion as a plug for a plug-and-socket connection.

9. The optoelectronic component according to claim 1, wherein the at least one of the connecters extends in its connecting portion transversely of the fastening portion of the heat sink.

10. The optoelectronic component according to claim 1, comprising at least three connecters.

11. The optoelectronic component according to claim 10, wherein at least two connecters are welded together with the heat sink.

12. The optoelectronic component according to claim 1, comprising at least four optoelectronic semiconductor chips.

13. The optoelectronic component according to claim 1, wherein areas of the chip end portions are not covered by the housing material.

14. The optoelectronic component according to claim 1, wherein an area of the opening is three or more times a total of chip areas of the at least one optoelectronic semiconductor chip.

15. The optoelectronic component according to claim 1, wherein the at least one optoelectronic semiconductor chip is a semiconductor chip of a thin-film construction, and wherein a predominant part of electromagnetic radiation generated by the chip in operation leaves the chip solely through a top surface of the chip which faces away from the heatsink.

* * * * *